US012694939B2

(12) United States Patent
Wambeke et al.

(10) Patent No.: US 12,694,939 B2
(45) Date of Patent: Jul. 28, 2026

(54) TRIPLE VIA CHAIN FOR ADVANCED INTERCONNECT IN A MEMORY DEVICE

(71) Applicant: Micron Technology, Inc., Boise, ID (US)

(72) Inventors: Ivo Thomas Wambeke, Boise, ID (US); James Eric Davis, Meridian, ID (US); Joshua Daniel Tomayer, Meridian, ID (US); Fulvio Rori, Boise, ID (US); Chiara Cerafogli, Boise, ID (US); Kenneth William Marr, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 84 days.

(21) Appl. No.: 18/759,105

(22) Filed: Jun. 28, 2024

(65) Prior Publication Data

US 2025/0014665 A1     Jan. 9, 2025

Related U.S. Application Data

(60) Provisional application No. 63/525,111, filed on Jul. 5, 2023.

(51) Int. Cl.
*G11C 29/12* (2006.01)
*G11C 29/32* (2006.01)
*G11C 29/42* (2006.01)

(52) U.S. Cl.
CPC .......... *G11C 29/32* (2013.01); *G11C 29/1201* (2013.01); *G11C 29/42* (2013.01); *G11C 2029/3202* (2013.01)

(58) Field of Classification Search
CPC ..... G11C 29/32; G11C 29/1201; G11C 29/42; G11C 2029/3202; G11C 29/025; G11C 29/48; G11C 16/08; G11C 16/12; G11C 16/14; G11C 16/24
See application file for complete search history.

(56) References Cited

U.S. PATENT DOCUMENTS

2011/0309359 A1* 12/2011 Saen ..................... G11C 29/025
                                                      257/E23.002
2012/0305917 A1* 12/2012 Yoko ...................... G11C 5/063
                                                      257/774
2023/0070785 A1* 3/2023 Lee ..................... H01L 25/0657

* cited by examiner

*Primary Examiner* — Mohammed A Bashar
(74) *Attorney, Agent, or Firm* — Lowenstein Sandler LLP

(57) ABSTRACT

A memory device can include a first portion having a memory array comprising a plurality of memory cells and a first via chain segment for performing a test operation. The memory device can include a second portion comprising processing circuitry and a second via chain segment for performing the test operation. The memory device can also include an interconnect coupling the first portion and the second portion, the interconnect comprising a third via chain segment, wherein the first via chain segment, second via chain segment, and third via chain segment can be selected independently.

20 Claims, 7 Drawing Sheets

400

□ Probe Pads 405

TOP OR BOTTOM
VIEW

401

500

SELECT A FIRST VIA CHAIN SEGMENT FOR A TEST OPERATION  505

TEST THE FIRST PORTION 510

DETERMINE ONE OR MORE ERRORS ASSOCIATED WITH THE FIRST PORTION 515

TRIPLE VIA CHAIN FOR ADVANCED INTERCONNECT IN A MEMORY DEVICE

RELATED APPLICATIONS

This application claims the benefit of priority from U.S. Provisional Application No. 63/525,111, filed Jul. 5, 2023. The entire contents of which are hereby incorporated by reference herein.

TECHNICAL FIELD

Embodiments of the disclosure relate generally to memory sub-systems, and more specifically, relate to a triple via chain for advanced interconnect implementation in a memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
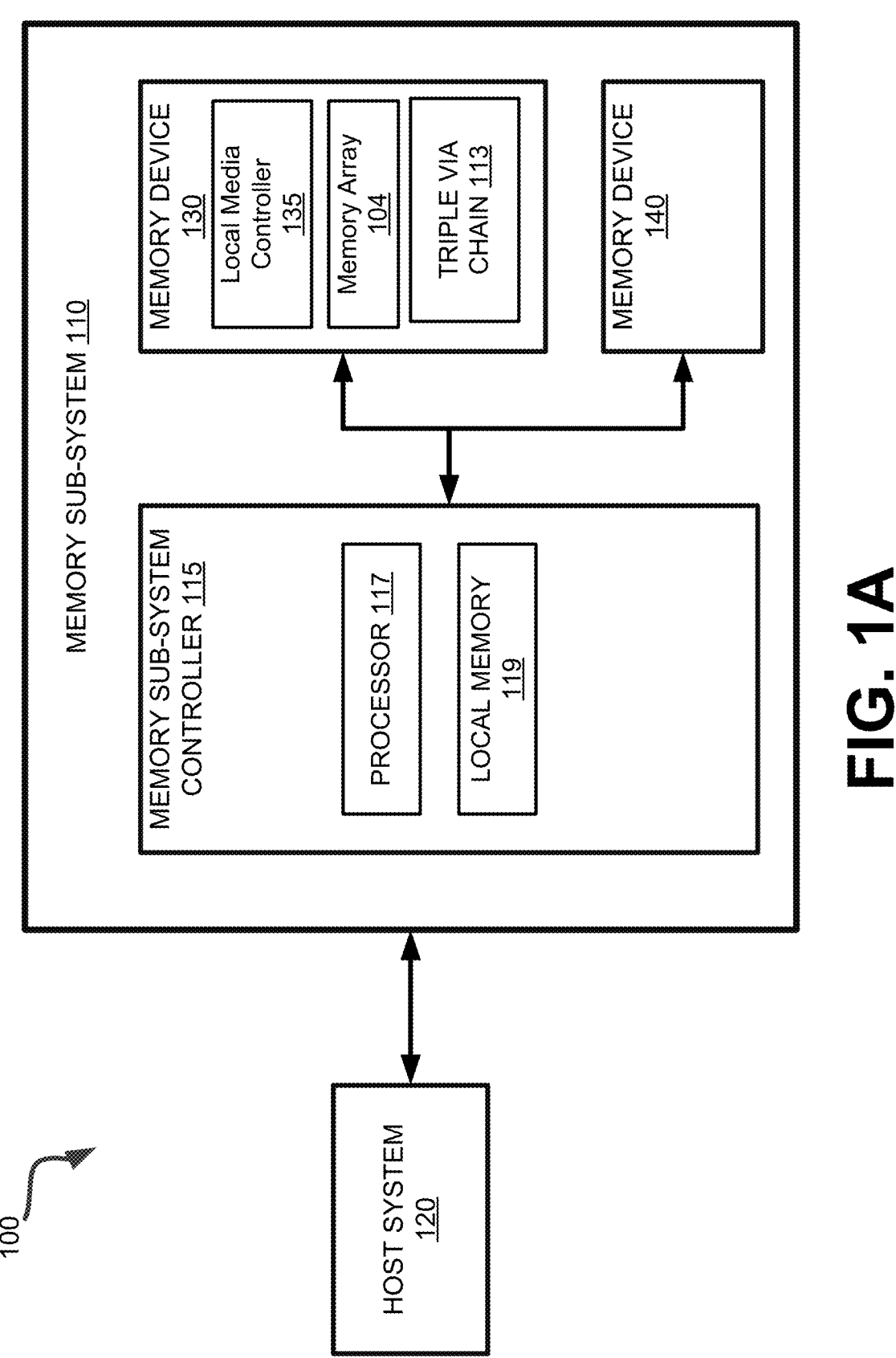
FIG. 1A illustrates an example computing system that includes a memory sub-system in accordance with some embodiments of the present disclosure.

Aspects of the present disclosure are directed to a triple via chain for advanced interconnect implementation. For example, a memory sub-system can include three independent via chains for testing an advanced interconnect system. A memory sub-system can be a storage device, a memory module, or a combination of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bit lines) and rows (also hereinafter referred to as wordlines). A wordline can refer to one or more rows of memory cells of a memory device that are used with one or more bit lines to generate the address of each of the memory cells. The intersection of a bit line and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane. Each data block can include a number of sub-blocks, where each sub-block is defined by an associated pillar (e.g., a vertical conductive trace) extending from a shared bit line. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of channel material. The memory cells can be coupled to access lines, which are commonly referred to as "word-lines," often fabricated in common with the memory cells, so as to form an array of strings in a block of memory. The compact nature of certain non-volatile memory devices, such as 3D flash NAND memory, means wordlines are common to many memory cells within a block of memory.

As described above, memory cells can be formed onto a silicon wafer in an array of bit lines and word lines. In some examples, an array of a memory device (e.g., an array chip or an integrated circuit that can store data) can be coupled with processing circuitry—e.g., with complementary metal-oxide-semiconductor (CMOS) components. The processing circuitry can be on a separate chip (e.g., on a second integrated circuit). Accordingly, the memory device can include an interconnect (e.g., an advanced interconnect) to couple the memory array portion with the processing circuitry. As fabrication techniques improve, additional processing challenges and stresses can occur for the advanced interconnect. For example, as memory devices get smaller and store more data, interconnects can become more compact causing degradation in performance. The smaller interconnects can also cause an increase in resistance-capacitance delay. Additionally, improved fabrication techniques can lead to thinner silicon that is more susceptible to cracking and causes additional edge stress (e.g., bowing, expanding, or contracting). Accordingly, performing quality checks and verifying the fabrication process can be critical to ensure memory cells can reliably store data.

Some solutions can perform quality checks by including electrical connections between layers in board—e.g., vertical electrical connections (via) through copper layers in a printed circuit board (PCB). The vias can be connected together to form a via chain that can enable signals to be transmitted from one end of the via chain to the other. This can enable a system to perform quality checks by forcing current or voltage on one terminal and grounding the other terminal and measuring voltage or current respectively. For example, the system can determine a high voltage measurement or a zero (0) current measurement respectively, which can indicate there is a crack, misalignment, or disconnection within the memory device. In other examples, the test can include forcing voltage on one terminal and floating the other terminal to measure current. In such examples, the system can determine a measurement of non-zero for the current, indicating there is some error causing the via chain to short. Solutions can include one via chain around each edge of the memory die. These solutions can have the via chain go from a bottom of a first chip (e.g., at the bottom of the CMOS chip or the memory array chip) up to the top of a second chip (e.g., at the top of the other of the CMOS chip or the memory array chip)—e.g., the via chain can go through the first chip, through the interconnect, up to the top of the second chip. The via chain can then proceed to go from the top of the second chip back down to the bottom of the first chip. However, having a single via chain going up and down through all of the chips and interconnects can cause large portions of the top or bottom chip to not be tested—e.g., there can be large portions of the upper or bottom portion that do not include a via chain and are not tested as the via chain is in the other chip instead. Accordingly, it can be difficult to accurately detect cracks, misalignments, disconnections, or other potential errors with the fabrication process.

Aspects of the present disclosure address the above and other deficiencies by utilizing a triple via chain (e.g., referring to a combination of via chains that are included in each layer of the three layers of the memory device) for advanced interconnect implementation in a memory device—e.g., there may be three via chain segments (triple via chain), one via chain in each layer of the memory device. For example, the memory device can include an independent via chain for each chip and/or interconnect—e.g., the memory device can include a via chain in a top chip, a bottom chip, and an interconnect layer. In one example, each via chain can go from a bottom of the chip or interconnect to the top of the chip of the chip or interconnect and then be connected back down to the bottom of the chip or interconnect. Accordingly, each chip or interconnect can include additional vias enabling more accurate fabrication testing. By utilizing the previously determined program voltage for the segment, the non-volatile memory device can determine cracks, disconnections, misalignments, and edge stresses in the array chip, CMOS chip, and interconnect more accurately.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include not-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In at least one embodiment, the memory device 130 can include a triple via chain component 113. In at least one embodiment, the triple via chain component 113 is utilized to test interconnect layers of memory sub-system 110 or of a respective memory device 130. In at least one embodiment, as described above, the memory sub-system 110 or memory device 130 can include the array 104 coupled with processing circuitry (e.g., with complementary metal-oxide-semiconductor (CMOS) components) via an advanced interconnect. In at least one embodiment, each layer (e.g., the array 104, the CMOS circuitry, and interconnect) can include an independent via chain segment as described with reference to FIG. 3. Accordingly, the memory device 130 can test the array 104, the CMOS circuitry, and the interconnect independently. In some embodiments, the test can include measuring a voltage or current across the via chain segment to determine if there are cracks, misalignments, or disconnections within the array 104, the CMOS circuitry, or the interconnect.

In some embodiments, the memory sub-system controller 115 includes at least a portion of triple via chain component 113—e.g., some circuitry to test the via chain segments. In other embodiment, local media controller 135 includes at least a portion of triple via chain component 113 and is configured to perform the functionality described herein. In such an embodiment, triple via chain component 113 can be implemented using hardware or as firmware, stored on memory device 130, executed by the control logic (e.g., voltage calibration component 113) to perform the operations related to a program operation described herein.

Figure 1B:
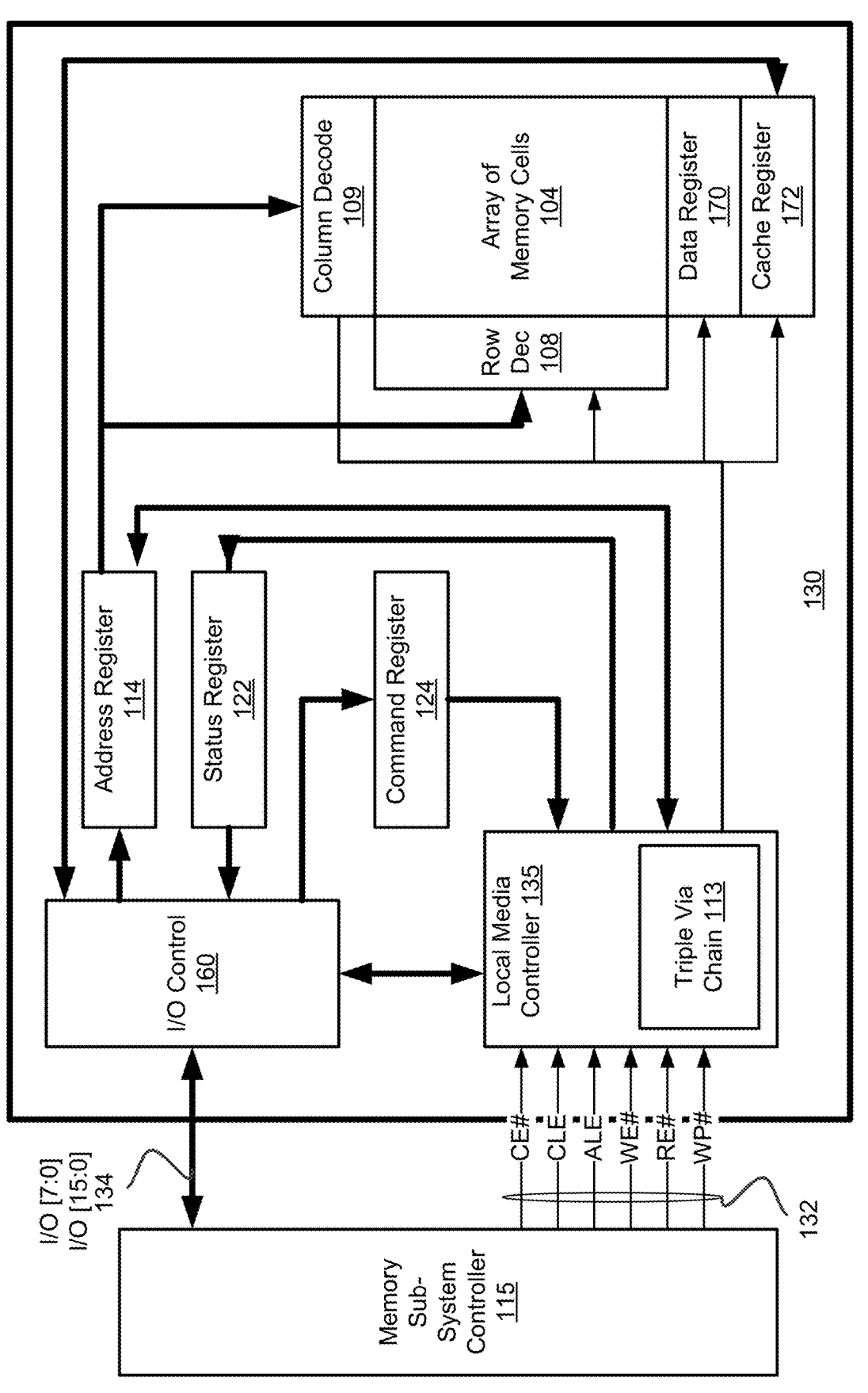
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device. The local media controller 135 can include the triple via chain component 113.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states. In one embodiment, the array of memory cells 104 (i.e., a "memory array") can include a number of sacrificial memory cells used to detect the occurrence of read disturb in memory device 130, as described in detail herein.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 160 and may then be written into command register 124. The addresses may be received over input/output (I/O) pins [7:0] of I/O bus 236 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0]

for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
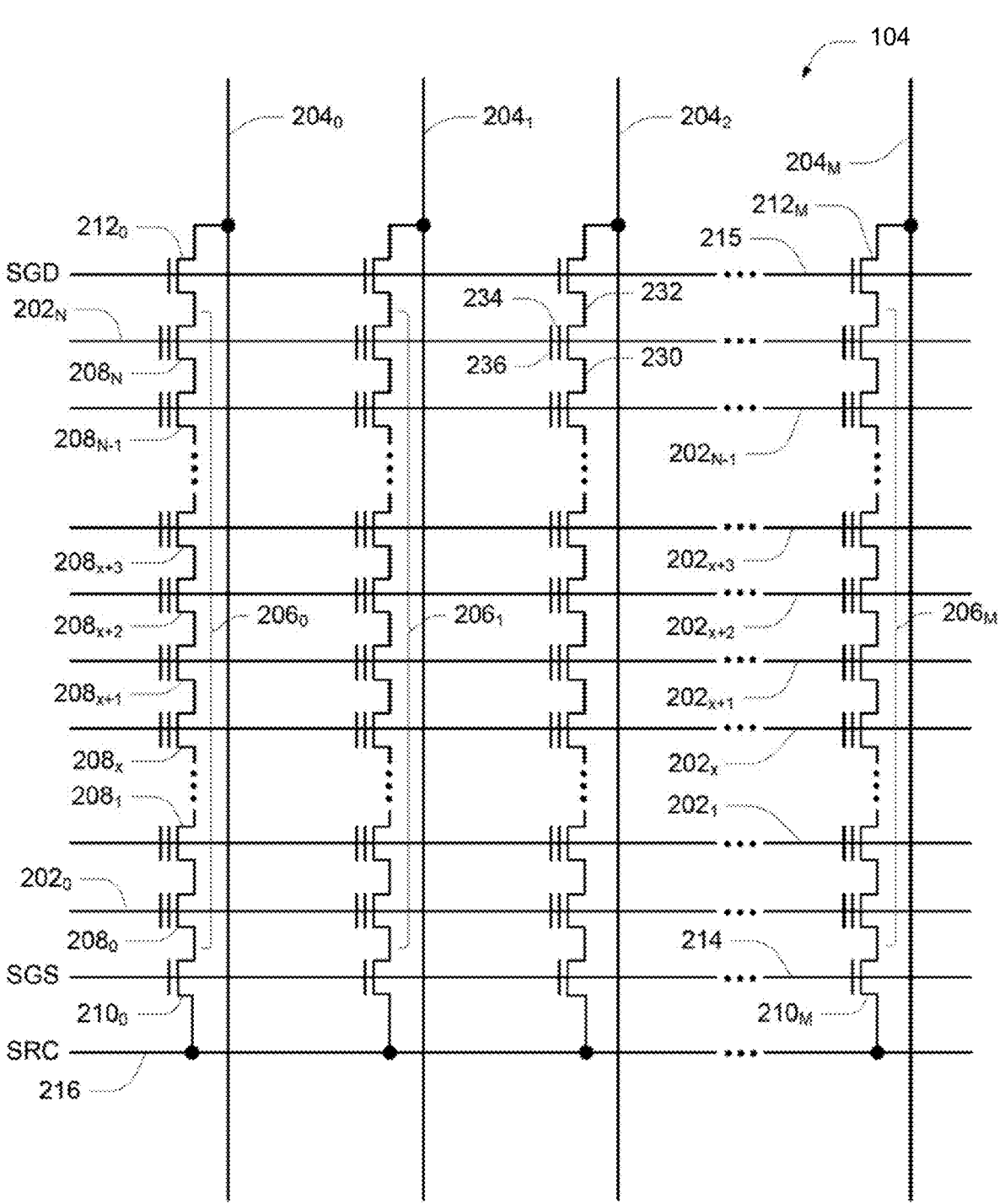
FIG. 2 is a schematic of portions of an array of memory cells as could be used in a memory of the type described with reference to FIG. 1B in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells or replacement gate (RG) NAND memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

In one embodiment, one or more of NAND strings 206 can be designated as sacrificial strings and used to detect read disturb in memory array 104. For example, NAND string $206_0$ can be designated a sacrificial string. In other embodiments, there can be different NAND strings or additional NAND strings, including two or more NAND strings, which are designated as sacrificial strings. In one embodiment, NAND string $206_0$ can include at least one sacrificial memory cell 208 from each wordline 202. These sacrificial memory cells 208 in the sacrificial memory string $206_0$ are not made available to the memory sub-system controller, and thus are not used to store host data. Rather, the sacrificial memory cells 208 remain in a default state (e.g., an erased state) or are programmed to a known voltage (e.g., a voltage corresponding to a known state). When a read operation is performed on any of the wordlines in memory array 104, a read voltage is applied to the selected wordline and a pass voltage is applied to the unselected wordlines, and the sacrificial memory cells will experience the same read disturb effects as the memory cells storing host data. When the read disturb effects become strong enough, one or more of the sacrificial memory cells can shift from the default or known state to a different state (e.g., to a state associated with a higher voltage level). Thus, local media controller 135 can perform a string sensing operation on the string of sacrificial memory cells to determine whether read disturb has occurred. In one embodiment, to perform the string sensing operation a predefined read voltage is applied to each wordline 202 concurrently, and the current through the sacrificial string $206_0$ is sensed. If any of the sacrificial memory cells 208 in the sacrificial string $206_0$ has shifted to a different state, the sacrificial string $206_0$ will not conduct and current will not flow. Thus, in such a situation, local media controller 135 can determine that read disturb is present in the block of memory array 104.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to wordline $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
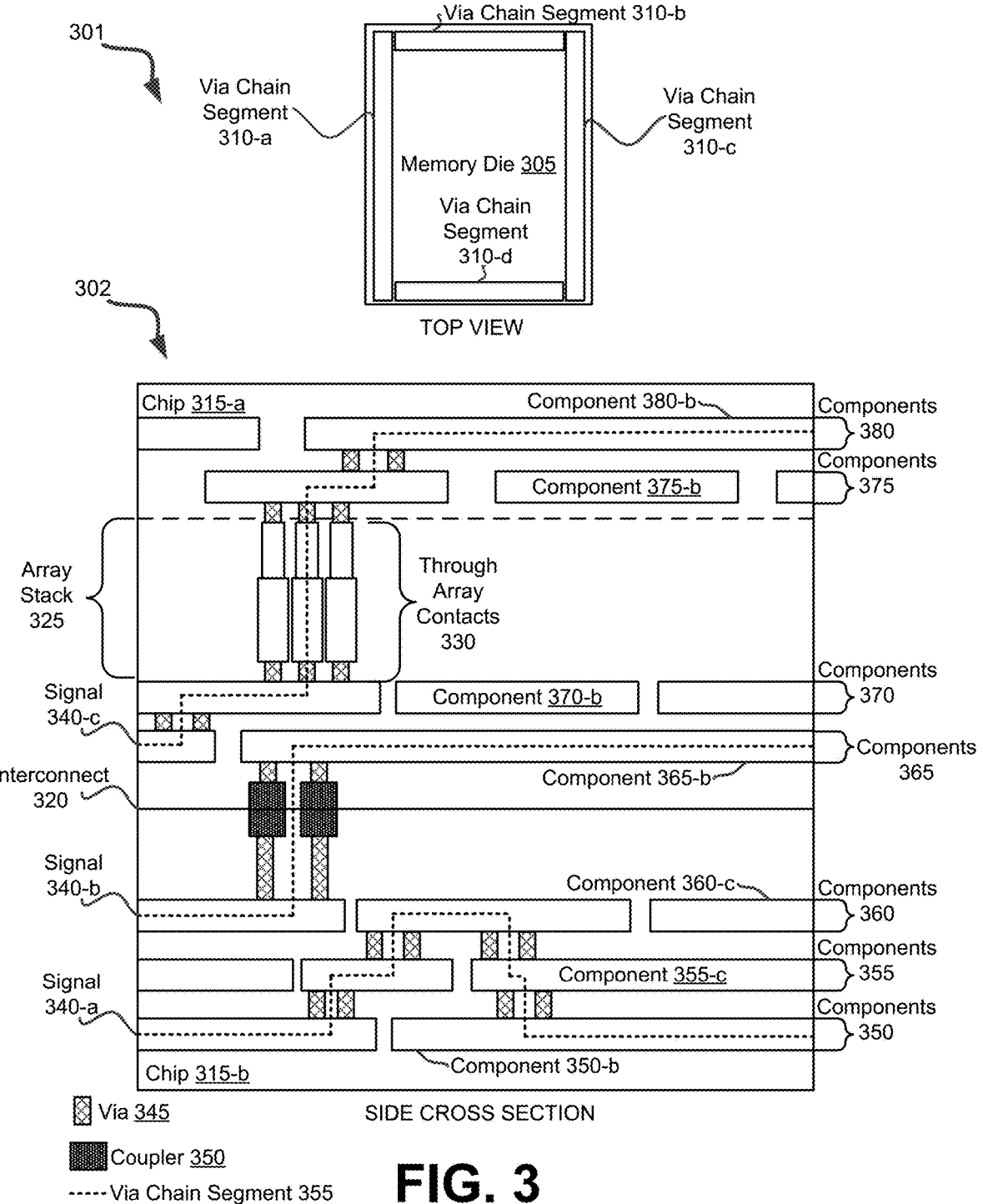
FIG. 3 is a diagram illustrating a triple via chain, in accordance with some embodiments of the present disclosure.

FIG. 3 is a diagram illustrating a triple via chain for interconnect implementation, according to at least one embodiment. FIG. 3 illustrates a top view 301 of a memory die 305 and a side cross section 302 of the memory die 305. As described above, the memory die can 305 can include multiple chips coupled via in interconnect—e.g., the memory die can include a chip 315-a coupled with a chip 315-b via the interconnect 320.

As illustrated in the top view 301, there can be a via chain segment 310 along each side of the memory die 305—e.g., via chain segment 310-a is along a left most edge of the memory die 305, via chain segment 310-b is along a top most edge of the memory die 305, via chain 310-c is along a right most edge of the memory die 305, and via chain segment 310-a is along a bottom most edge of the memory die 305. In at least one embodiment, each via chain segment 310 can enable signals to be transmitted along a respective edge of the memory die 305. In such embodiments, the triple via chain component 113, as described with reference to FIG. 1, can perform quality checks by transmitting signals from one end of a via chain segment 310 to the other end of the via chain segment 310—e.g., via chain segment 310-a can enable a signal to go from the bottom most edge to the top most edge along the right edge of the memory die 305 to test for cracks, misalignment, or disconnections within the memory die 305. In one embodiment, the system can perform a quality test using the via segments 310-a by forcing voltage on one terminal while grounding the other terminal and measuring a current. Conversely, the system can instead force a current on one terminal while grounding the other terminal and measuring voltage. In at least one embodiment, a current measurement of zero (0) or a high voltage measurement (e.g., a voltage near infinity that meets or exceeds a non-zero threshold voltage level) can indicate there is a crack, misalignment, or disconnection within the memory device. In other examples, the system can perform a quality test by forcing voltage on one terminal and floating the other terminal to measure current. Conversely, the system can instead for a current on one terminal while the other terminal is floated to measure voltage. In such embodiments, if the system measures a current that is non-zero or a low voltage (e.g., a voltage not near infinity that is less than a non-zero threshold voltage level), the system can determine that there is some error causing the via chain to short. In some embodiments, the system can also utilize a via chain segment 310 to determine transmission line (T-line) characteristics—e.g., to determine series resistance due to conductor resistivity, determine shunt conductance due to leakage currents, determine series inductance due to magnetic field surrounding conductors, or shunt capacitance due to an electric field between conductors. In one example, the system can transmit a high-frequency signal having a rising edge and/or falling edge from a first end of the via chain segment 310. In such examples, the system can then measure an output at a second end of the via chain segment 310 to determine a frequency response of the transmission line—e.g., an edge matching the initial signal at the output can indicate a high-frequency signal is being transmitted accurately while an edge not matching the initial signal at the output can indicate the high-frequency signal is not being transmitted accurately. Additional details regarding the transmission line test are described with reference to FIG. 4.

Although top view 301 illustrates four (4) via chain segments 310, the memory die 305 can include any number of via chain segments validating continuity of the sides and/or corners 310—e.g., one (1), two (2), three (3), four (4), five (5), six (6), etc. In at least one embodiment, each via chain segment 310 is independent of another via chain segment 310. For example, a crack along a right most edge in the memory die 305 can cause a short in via chain 310-a but not affect the remaining via chain segments 310 as the rest are independent of via chain 310-a. Accordingly, the system can determine which edge, if any, includes a crack, misalignment, or disconnection. Additionally, the top view 301 can illustrate the via chain segments 310 of one (1) layer of the memory die 305—e.g., the top view 301 can illustrate the via chain segments 310 going through chip 315-a. As illustrated in side cross section view 302, there can be at least three (3) via chain segments 355 along any given edge of the memory die 305.

Side cross section 302 of FIG. 3 can illustrate a chip 315-*a* coupled to chip 315-*b* via an interconnect 320 in the memory die 305. In one embodiment, the chip 315-*a* or chip 315-*b* is an array chip—e.g., a chip that includes a memory array. In another embodiment, the chip 315-*a* or chip 315-*b* is an example of a complementary metal-oxide-semiconductor (CMOS) chip—e.g., a chip that includes CMOS circuitry. As illustrated in side cross section 302, the chip 315-*a* is an array chip and chip 315-*b* is a CMOS chip. In one example, each chip 315 can include multiple layers or tiers—e.g., multiple tiers of oxide or metals. Each tier can include components or memory cells. For example, the chip 315-*a* can include components 365, components 370, components 375, and components 380, where each respective components are in a different tier. In one embodiment, components 365, components 370, components 375, and components 380 are examples of components described with reference to FIG. 1B—e.g., the components can represent I/O control 160, address register 114, address register 122, etc. as described with reference to FIG. 1B). In other embodiments, components 365, components 370, components 375, and components 380 can be examples of other circuitry performing functions related to the memory array. In at least one embodiment, the chip 315-*a* can include any number of additional components or tiers not illustrated to store and process data. Additionally, the side cross section 302 can illustrate one portion of the memory die 305 along an edge. Each tier illustrated in side cross section 302 can extend along the edges—e.g., there can be additional components 365, components 370, through array contacts 330, components 375, and components 380.

In at least one embodiment, the chip 315-*a* can include an array stack 325—e.g., a portion of chip 315-*a* can be utilized for the array stack 325. In one embodiment, the array stack 325 can include one or more layers (e.g., tiers of oxide or metals), where memory cells are formed on each layer. The array stack 325 can also include through array contacts 330—e.g., contacts that enable signals to travel through the layers of memory cells. For example, the through array contacts 330 can enable signals coming from components 370 to travel through the array stack 325 or to a respective layer of the array stack 325.

In one embodiment, chip 315-*a* can include a via chain segment 355 (e.g., include via chain segment 310-*a*). For example, the chip 315-*a* can include vias 345 that couple various components within the chip 315-*a* to enable a signal 340-*c* to pass through the chip 315-*a*. In at least one embodiment, vias 345 can couple component 365-*a* with component 370-*a*, couple component 370-*a* with the through array contacts 330, couple the through array contacts with component 375-*a*, and couple component 375-*a* with component 380-*a*. Accordingly, a signal 340-*c* can travel from component 365-*a*, up through components 370, the through array contacts 330, components 375, to component 380-*b*. As described earlier, the side cross section 302 can show a portion of an edge of the memory die 305. Accordingly, the chip 315-*a* can include additional vias 345 that enable the signal 340-*c* to go from components 380 back down through chip 315-*a* to the components 365—e.g., the chip 315-*a* can include additional vias 345 that enable the signal 340-*c* to then travel from components 380 to components 375, down through the array contacts 330, through components 370, and back to the components 365—e.g., the signal 340-*c* can travel from bottom to top and then back down to the bottom as illustrated with reference to signal 340-*a* through chip 315-*b*.

By utilizing a via chain in the chip 315-*a*, the triple via chain component 113, as described with reference to FIG. 1, can monitor cracks more accurately. Additionally, implementing the via chain in the chip 315-*a* can enable the system to monitor the through array contacts 330—e.g., verify if signals are accurately transmitted through the through array contacts 330 and/or determine transmission line (T-line) characteristics of the through array contacts 330. In one embodiment, the signal 340-*c* passing through the via chain can enable the system to verify the routing of the chip 315-*a* without relying on the advanced interconnect 320. For example, the system can determine there is an issue with the routing within the chip 315-*a* if the via chain is shorted instead of having to verify if there is an issue with the routing within chip 315-*a* or an issue with the interconnect 320 itself.

In at least one embodiment, chip 315-*b* can also include multiple layers or tiers—e.g., multiple tiers of oxide or metals. In one embodiment, chip 315-*b* can include components 350, components 355, components 360, each in a respective tier. In one embodiment, the components 350, components 355, components 360 are examples of components described with reference to FIG. 1B—e.g., the components can represent I/O control 160, address register 114, address register 122, etc. as described with reference to FIG. 1B). In other embodiments, components 350, components 355, and components 360 can be examples of other circuitry performing functions related to the memory array. In at least one embodiment, the chip 315-*b* can include any number of additional components or tiers not illustrated to store and process data.

In at least one embodiment, chip 315-*b* can include a via chain segment 355. For example, the chip 315-*b* can include vias 345 that couple various components within the chip 315-*b* to enable the signal 340-*a* to pass through the chip 315-*b*. For example, vias 345 can couple component 350-*a* with component 355-*b*, couple component 355-*b* with component 360-*b*, couple component 360-*b* with component 355-*c*, and couple component 355-*c* with component 350-*b*. Accordingly, the signal 340-*a* can travel through component 350-*a* up to component 355-*b*, then up to and through component 360-*b*, and then return back down through component 355-*c* to component 350-*b*. Accordingly, the via chain segment can enable the signal 340-*a* to travel from a bottom of the chip 315-*b* to the top of chip 315-*b* and then from the top of the chip 315-*b* to the bottom of the chip 315-*b*.

By utilizing a via chain in the chip 315-*b*, the system (can monitor cracks more accurately. In at least one embodiment, the via chains can be safe high voltage (SPH) capable. In such embodiments, the system can utilize the via chain within chip 315-*b* to determine or measure delamination (e.g., fractures within layers or tiers of chip 315-*b*) from the center of the memory die 305 out to the memory die 305 border—e.g., out to a respective edge of the memory die 305. In at least one embodiment, the system can also utilize the via chain within chip 315-*b* as if it were a SPH capacitor to measure the signal 340-*a* at a relatively high voltage.

In at least one embodiment, an interconnect 320 can couple the chip 315-*a* with chip 315-*b*. In one embodiment, couplers 350 (e.g., coupling mechanisms) can couple the chip 315-*a* with chip 315-*a* through the interconnect 320. In one embodiment, the memory die 305 can also include at least a third via chain segment 355 through the interconnect 320. For example, the memory die 305 can include vias 345 that couple component 360-*a* of chip 315-*b* with component 365-*b* of chip 315-*a* e.g., enable signal 340-*b* to pass through the interconnect 320. In some embodiments, the memory die 305 can include additional vias 345 that enable the signal 340-*b* to return through the interconnect 320 to another component 360 of chip 315-*b*.

In at least one embodiment, the system can utilize the via chain through the interconnect 320 to check for misalignments, cracks, or extra stresses and expansion at an edge of the memory die 305—e.g., check for bowing, expanding, or contracting. In at least one embodiment, the system can determine there may be cracks, stresses, or misalignments, if there is a high resistance across the interconnect 320 when transmitting the signal 340-*b*. In one embodiment, the system can utilize the via chain across the interconnect 320 to monitor the interconnect 320—e.g., monitor the connections between the chip 315-*a* and chip 315-*b* to ensure they are reliably transmitting signals. In one embodiment, the system can also utilize the via chain across the interconnect 320 to measure the t-line characteristics of the interconnect 320 contacts.

Although not illustrated, the memory die 305 can include circuitry (e.g., multiplexers) so that any respective via chain segment can be selected. That is, the via chain can be segmented into the any number of via chain segments 310 and be multiplexed to enable the system to select an edge, edge segment, or corner of the memory die 305 for testing— e.g., the system can independently check or verify each edge, edge segment, or corner of the memory die 305. In one embodiment, the each via chain through the chip 315-*a*, chip 315-*b*, and interconnect 320 can also be multiplexed to enable the system to select the chip 315-*a*, chip 315-*b*, and/or interconnect 320 for testing—e.g., the system can independent check the chip 315-*a*, chip 315-*b*, or the interconnect 320. Additionally, the system can include multiplexers or other circuitry to select a type of test to perform— e.g., one of forcing current on one end and grounding the other, forcing voltage on one end and floating the other end, or transmitting a high-frequency signal to compare an input at one end of the via chain segment versus an output at the other end of the via chain segment.

Figure 4:
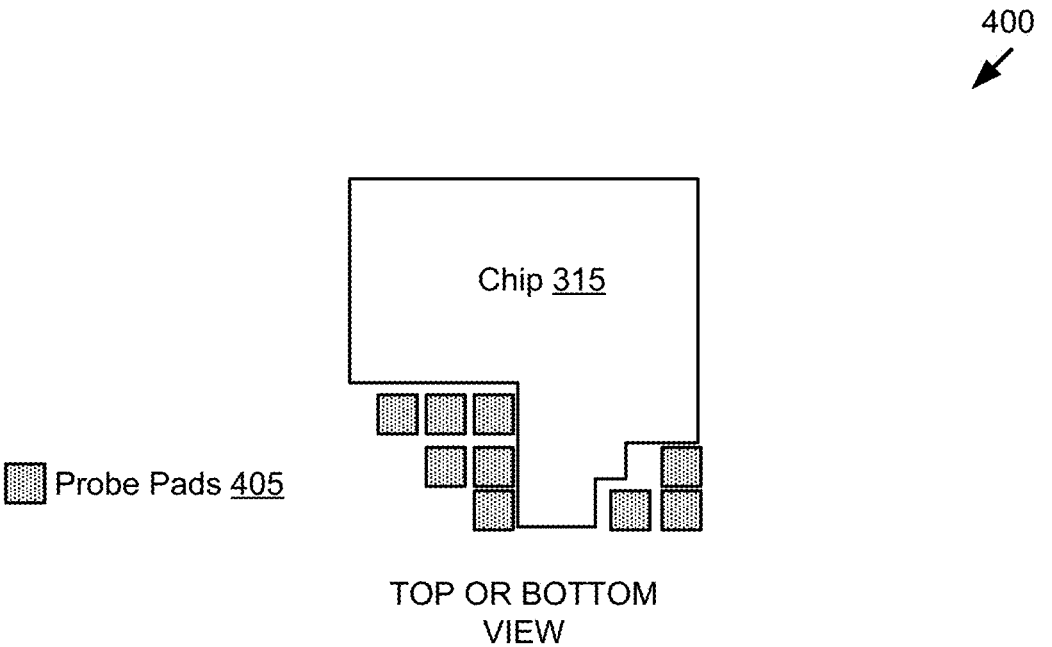
FIG. 4 is a diagram illustrating via chain measurements, in accordance with some embodiments of the present disclosure.
Figure 4:
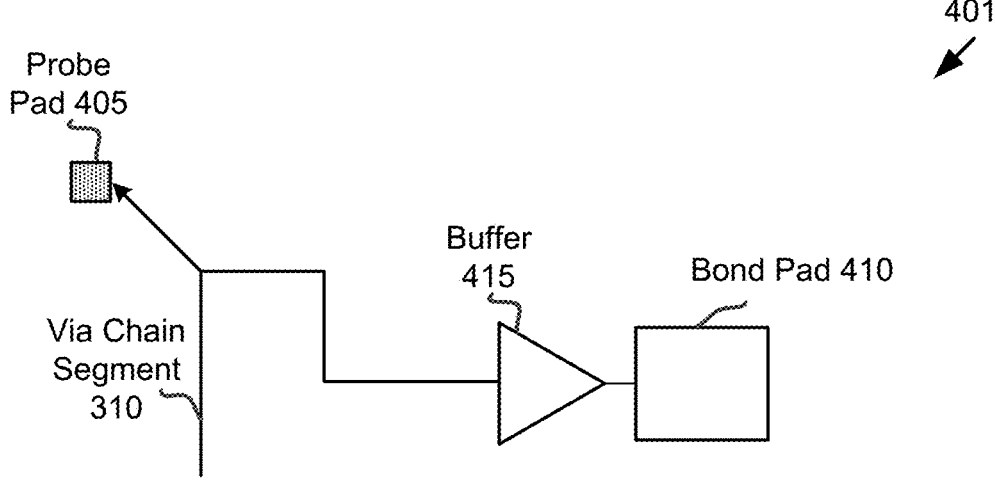

FIG. 4 is diagram illustrating via chain measurements, in accordance with at least one embodiment. FIG. 4 can illustrate a top or bottom view 400 and a via chain output 401. As described with reference to FIG. 3, a system (e.g., system 100) can utilize via chain (e.g., via chain segments 310) to measure transmission line (t-line) characteristics— e.g., t-line characteristics of the through-array contacts 330 or interconnect 320 as described with reference to FIG. 3. In such embodiments, the system can transmit a high-frequency signal from a first end of the via chain segment 310 to a second end of the via chain segment 310. In at least one embodiment, the system can compare an input (e.g., the signal at the first end of the via chain) with an output (e.g., the signal at the second of the via chain). For example, the high-frequency signal can have a rising and/or falling edge. The system can compare the edge measured of the signal at the first end with an edge measured at the second end. Accordingly, the system can determine if the high-frequency signal is accurately routed through the memory die (e.g., memory die 305 as described with reference to FIG. 3).

In least one embodiment, an end (e.g., the second end) of the via chain segment can include a buffer 415 coupled with a bond pad 410. In one embodiment, a signal (e.g., signal 340) can be measured at the buffer 415—e.g., the system can include additional components to measure the signal at the buffer 415. In some embodiments, the buffer can be a safe high voltage (SHV) component. In such embodiments, a capacitance of the bond pad 410 can affect the buffer 415 e.g., the buffer 415 can be unable to accurately measure a high-frequency signal. In such embodiments, the system can perform the measurement of the signal at the probe pads 405. For example, the top or bottom of a chip 315 (e.g., chip 315-*a* or chip 315-*b*) can include one or more probe pads 405. In one embodiment, the probe pads 405 can enable the system to measure the signal before it is affected by the bond pad 410. For example, the system can measure the signal (e.g., signal 340) at the probe pad 405 illustrated in via chain output 401. This can enable the signal to be measured accurately and be unaffected by a capacitance of the bond pad 410. Accordingly, the system can compare the input of the signal with an output at either the probe pad 405 or buffer 415—e.g., depending on a capacitance of the bond pad 410 and its effect on the signal.

Figure 5:
FIG. 5 is a flow diagram of an example method of utilizing a previously stored resample start voltage for calibration in a program operation, in accordance with some embodiments of the present disclosure.
Figure 5:
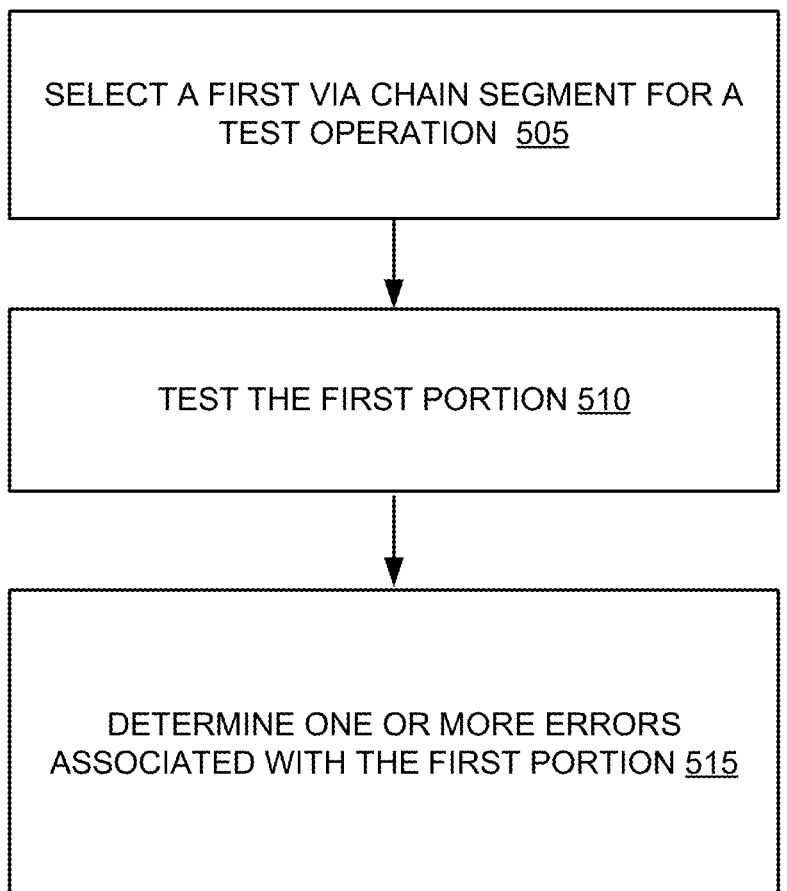

FIG. 5 is a flow diagram of an example method of utilizing a triple via chain for advanced interconnects, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by utilizing via chain segments as described with reference to FIG. 3. In at least one embodiment, the method 500 is performed by processing logic or by the triple via chain component 113 as described with reference to FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, a first via chain segment of one or more via chain segments is selected for a test operation. For example, the processing logic can select, at a first portion of a memory device, such as memory device 130, the first via chain segment for a test operation. In one embodiment, the one or more via chain segments can include a second via chain segment at a second portion of the memory device and a third via chain segment at a third portion of the memory device. In at least one embodiment, the first portion, second portion, and third portion of the memory device can correspond to chip 315-*a*, chip 315-*b*, and the advanced interconnect 320 as described with reference to FIG. 3—e.g. each chip and interconnect of the memory device can include an independent via chain for testing purposes. In at least one embodiment, the first via chain segment can include a plurality of portions, each portion corresponding to a side of the memory device. That is, the memory device can include four (4) sides, and each side can have a portion of the via chain segment as illustrated in a top view 301 of FIG. 3. In one embodiment, the processing logic can select a first portion of the plurality of portions of the first via chain segment, wherein the first portion is associated with a first side of the memory device and test the first side of the memory device responsive to selecting the first portion. In at least one embodiment, each portion of the via chain segment can be independent of the other—e.g., any portion of the via chain segment can be selected to perform test operations associated with a side of the memory device. In some embodiments, the processing logic can select, at the second portion of the memory device, the second via chain segment of one or more via chain segments of the memory device for a second test operation, where the second test operation is independent of the first test operation. That is, the processing logic can select each via chain segment independently from the other for a respective test operation—e.g., the processing logic can select the first via chain segment to test the first portion and select the second via chain segment to test the second portion.

At operation 510, first portion of the memory device is tested. For example, the processing logic tests the first portion of the memory device responsive to selecting the first via chain segment. In at least one embodiment, the processing logic can test the first portion by driving a current on a first terminal of the first via chain segment, grounding a second terminal of the first via chain segment, and measuring a voltage at the second terminal responsive to ground the second terminal. In such embodiments, the processing logic can measure the voltage across the via chain. For example, the processing logic can determine the voltage is zero, where determining the one or more errors associated with the first portion of the memory device is responsive to determining the voltage is zero—e.g., a voltage of zero can indicate a crack, misalignment, or other issue within the first portion of the memory device that causes the voltage at the second terminal to be zero. In other embodiments, the processing logic can determine the voltage is non-zero and determine a lack of errors associated with the first portion responsive to determining the voltage is non-zero—e.g., if the processing logic determines the voltage is non-zero, then there can be an absence of cracks or misalignments within the first portion of the memory device. In at least one embodiment, the processing logic can test the first portion by driving a voltage on a first terminal of the first via chain segment, floating a second terminal of the first via chain segment, and measuring a current at the second terminal responsive to ground the second terminal. In this embodiment, floating the second terminal can refer to isolating the second terminal from any voltage source—e.g., the second terminal can be isolated and in a floating state. In at least one embodiment, the processing logic can measure current when driving the voltage at the first terminal. For example, the processing logic can determine a non-zero current, where determining the one or more errors associated with the first portion of the memory device is responsive to determining the current is non-zero—e.g., determining the current is non-zero can indicate a crack or misalignment. In other embodiments, the processing logic can determine the current is zero and accordingly determine an absence of errors— e.g., measuring a current of 0 can indicate a lack of cracks or misalignments. In one embodiment, the processing logic can perform the test operation by transmitting a signal from a first terminal of the first via chain segment to a second terminal of the first via chain segment and comparing the signal at the first terminal with the signal at the second terminal—e.g., the memory device can include a comparator that compares the signal transmitted to the first terminal and the signal received at the second terminal. In at least one embodiment, the processing logic can determine transmission line characteristics of the first via chain segment responsive to comparing the signal—e.g., determine series resistance due to conductor resistivity, determine shunt conductance due to leakage currents, determine series inductance due to magnetic field surrounding conductors, or shunt capacitance due to an electric field between conductors as described with reference to FIG. 3.

At operation 515, one or more errors associated with the first portion of the memory device are determined. For example, the processing logic can determine one or more errors associated with the first portion responsive to testing the first portion of the memory device. That is, the processing logic can detect cracks, misalignments, disconnections, or other potential errors with the fabrication process responsive to performing the test operation.

In at least one embodiment, the memory device includes a first portion comprising a memory array comprising a plurality of memory cells and a first via chain segment for performing a test operation—e.g., the chip 315-a as described with reference to FIG. 3. The memory device also includes a second portion comprising processing circuitry and a second via chain segment for performing the test operation—e.g., chip 315-b as described with reference to FIG. 3. In at least on embodiment, the memory device includes an interconnect coupling the first portion and the second portion, the interconnect comprising a third via chain segment—e.g., the interconnect 320 as described with reference to FIG. 3. In at least one embodiment, the first via chain segment, second via chain segment, and third via chain segment can be selected independently—e.g., a multiplexer can select any one of the via chain segments for the test operation. In at least one embodiment, the first via chain segment, the second via chain segment, and the third via chain segment each comprise a plurality of portions, wherein a portion of the plurality of portions corresponds to a side of the memory device—e.g., as illustrated by top view 301.

In some embodiments, the memory device includes a multiplexer coupled with the plurality of portions of the first via chain segment, second via chain segment, and third via chain segment, where the multiplexer is to select a first portion of the plurality of portions during the test operation—e.g., select which side to test of the memory device. In some embodiments, the first via chain segment comprises a first terminal and a second terminal and a comparator is coupled to the second terminal of the first via chain segment, the comparator to compare a first signal at the second terminal with a second signal generated at the first terminal—e.g., determine T-line characteristics as described with reference to FIG. 3. In some embodiments, the first terminal is to drive a current or voltage to the first via chain segment and the second terminal is grounded during the test operation. In other embodiments, the first terminal is to drive a current or voltage to the first via chain segment and the second terminal is in a floating state during the test operation. In at least one embodiment, the memory device includes a multiplexer coupled with the first via chain segment, the second via chain segment, and the third via chain segment, where the multiplexer is to select the first via chain segment, the second via chain segment, or the third via chain segment for the test operation.

Figure 6:
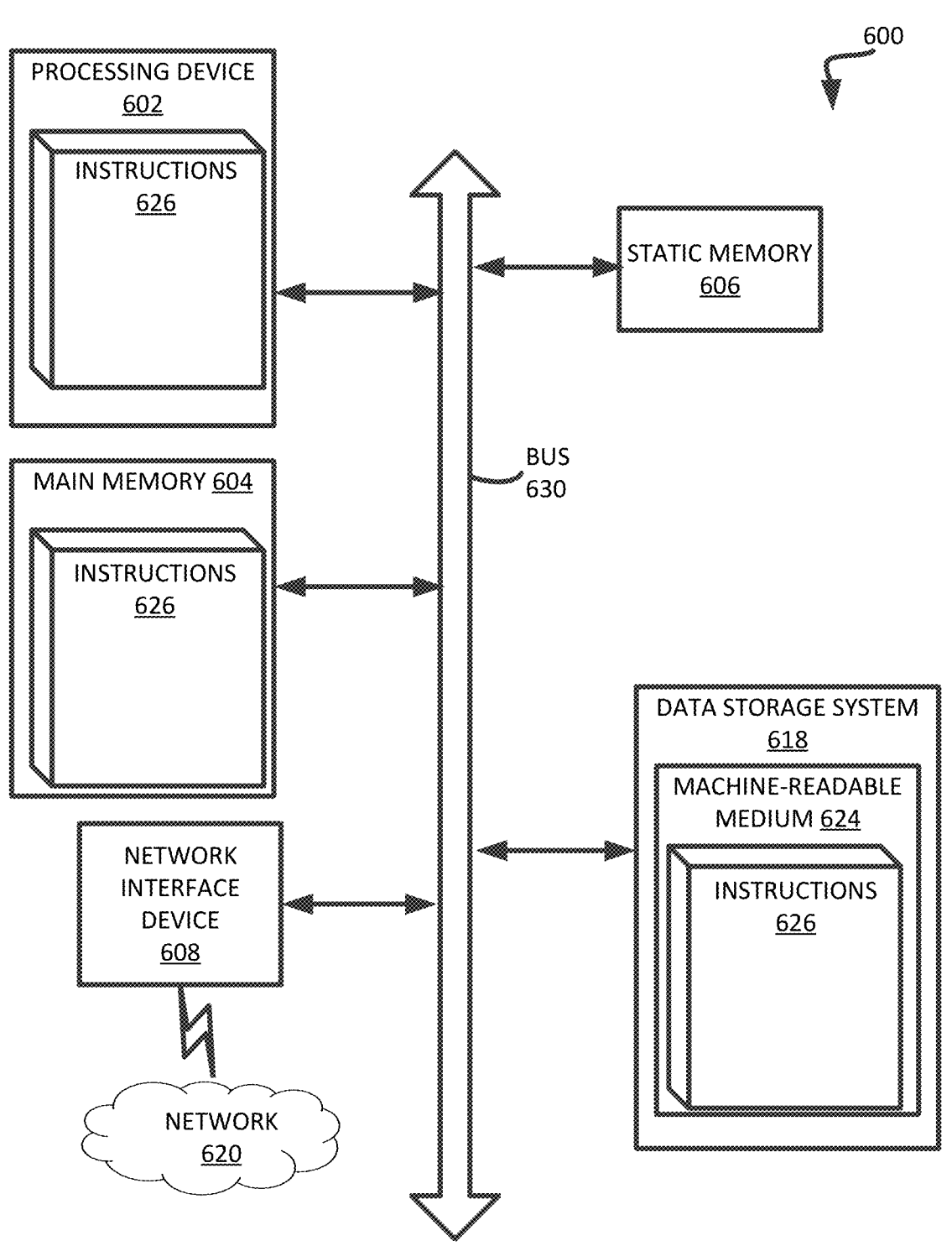
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to utilizing triple via chain 113 of FIG. 1 to perform a test operation). In at least one embodiment, the memory device can include a triple via chain, where each portion of the memory device includes an independent via chain segment. For example, the memory device can include a first chip, a second chip, and an interconnect to couple the first chip and the second chip. In at least one embodiment, the first chip, second chip, and interconnect can include an independent via chain segment as described with reference to FIGS. 1-5. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a voltage application component 113 to perform a read operation for the processing device 602. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a first portion comprising a memory array comprising a plurality of memory cells and a first via chain segment for performing a test operation;
a second portion comprising processing circuitry and a second via chain segment for performing the test operation; and
an interconnect coupling the first portion and the second portion, the interconnect comprising a third via chain segment, wherein the first via chain segment, second via chain segment, and third via chain segment can be selected independently, and wherein the first via chain segment, the second via chain segment, and the third via chain segment are each configured to detect physical defects including at least one of cracks, misalignments, or disconnections within respective portions of the memory device by measuring at least one of voltage or current across respective via chain segments.

2. The memory device of claim 1, wherein the first via chain segment, the second via chain segment, and the third via chain segment each comprise a plurality of portions, wherein a portion of the plurality of portions corresponds to a side of the memory device.

3. The memory device of claim 2, further comprising:
a multiplexer coupled with the plurality of portions of the first via chain segment, second via chain segment, and third via chain segment, wherein the multiplexer is to select a first portion of the plurality of portions during the test operation.

4. The memory device of claim 1, wherein the first via chain segment comprises a first terminal and a second terminal, the memory device further comprising:
a comparator coupled to the second terminal of the first via chain segment, the comparator to compare a first signal at the second terminal with a second signal generated at the first terminal.

5. The memory device of claim 1, wherein the first via chain segment comprises a first terminal and a second terminal, and wherein:
the first terminal is to drive at least one of a current or a voltage to the first via chain segment; and
the second terminal is grounded during the test operation.

6. The memory device of claim 1, wherein the first via chain segment comprises a first terminal and a second terminal, and wherein:

the first terminal is to drive at least one of a current or a voltage to the first via chain segment; and
the second terminal is in a floating state during the test operation.

7. The memory device of claim 1, further comprising:
a multiplexer coupled with the first via chain segment, the second via chain segment, and the third via chain segment, wherein the multiplexer is to select the first via chain segment, the second via chain segment, or the third via chain segment for the test operation.

8. A method, comprising:
selecting, at a first portion of a memory device, a first via chain segment of one or more via chain segments of the memory device for a test operation, wherein the one or more via chain segments comprises a second via chain segment at a second portion of the memory device and a third via chain segment at a third portion of the memory device;
testing the first portion of the memory device responsive to selecting the first via chain segment; and
determining one or more errors associated with the first portion of the memory device responsive to testing the first portion of the memory device, wherein the first via chain segment, the second via chain segment, and the third via chain segment are each configured to detect physical defects including at least one of cracks, misalignments, or disconnections within respective portions of the memory device by measuring at least one of voltage or current across respective via chain segments.

9. The method of claim 8, wherein testing the first portion of the memory device further comprises:
driving at least one of a current or a voltage on a first terminal of the first via chain segment;
grounding a second terminal of the first via chain segment; and
measuring at least one of an output voltage or an output current at the first terminal responsive to grounding the second terminal.

10. The method of claim 9, further comprising:
determining at least one of that the output voltage is near ground or that the output current is high, wherein determining the one or more errors associated with the first portion of the memory device is responsive to determining the at least one of that the output voltage is near ground or that the output current is high.

11. The method of claim 9, further comprising:
determining at least one of that the output voltage is not near ground or that the output current is not high; and
determining a lack of errors associated with the first portion responsive to determining the at least one of that the output voltage is not near ground or that the output current is not high.

12. The method of claim 8, wherein testing the first portion of the memory device further comprises:
driving a voltage on a first terminal of the first via chain segment;
floating a second terminal of the first via chain segment; and
measuring a current at the first terminal responsive to floating the second terminal.

13. The method of claim 12, further comprising:
determining a non-zero current, wherein determining the one or more errors associated with the first portion of the memory device is responsive to determining the current is non-zero.

14. The method of claim 8, wherein testing the first portion of the memory device further comprises:

transmitting a signal from a first terminal of the first via chain segment to a second terminal of the first via chain segment;

comparing the signal at the first terminal with the signal at the second terminal; and determining transmission line characteristics of the first via chain segment responsive to comparing the signal.

15. The method of claim 8, wherein the first via chain segment comprises a plurality of portions, each portion corresponding to at least one of a side, segment, or corner of the memory device, the method further comprising:

selecting a first portion of the plurality of portions of the first via chain segment, wherein the first portion is associated with at least one of a first side, a first segment, or a first corner of the memory device; and testing the at least one of the first side, the first segment, or the first corner of the memory device responsive to selecting the first portion.

16. The method of claim 8, further comprising:

selecting, at the second portion of the memory device, the second via chain segment of one or more via chain segments of the memory device for a second test operation, wherein the second test operation is independent of the test operation.

17. A memory device comprising:

a memory array comprising memory cells; and control logic coupled to the memory array, the control logic to:

select, at a first portion of the memory device, a first via chain segment of one or more via chain segments of the memory device for a test operation, wherein the one or more via chain segments comprises a second via chain segment at a second portion of the memory device and a third via chain segment at a third portion of the memory device;

test the first portion of the memory device responsive to selecting the first via chain segment; and determine one or more errors associated with the first portion of the memory device responsive to testing the first portion of the memory device, wherein the first via chain segment, the second via chain segment, and the third via chain segment are each configured to detect physical defects including at least one of cracks, misalignments, or disconnections within respective portions of the memory device by measuring at least one of voltage or current across respective via chain segments.

18. The memory device of claim 17, wherein to test the first portion, the control logic is to:

drive at least one of a current or a voltage on a first terminal of the first via chain segment;

ground a second terminal of the first via chain segment; and measure at least one of an output voltage or an output current at the first terminal responsive to grounding the second terminal.

19. The memory device of claim 18, wherein the control logic is to:

determine at least one of that the output voltage is zero or the output current is high, wherein the control logic is to determine the one or more errors associated with the first portion of the memory device responsive to determining the at least one of that that the output voltage is zero or the output current is high.

20. The memory device of claim 18, wherein the control logic is to:

determine that the output voltage is non-zero or that the output current is not high; and determine a lack of errors associated with the first portion responsive to determining the at least one of that the output voltage is non-zero or the output current is not high.

* * * * *